United States Patent
Hartin et al.

(10) Patent No.: US 11,837,524 B2
(45) Date of Patent: Dec. 5, 2023

(54) LOCALIZED TARGETED THERMOELECTRIC COOLING THERMAL CONTROL OF INTEGRATED CIRCUITS WITH SUB-DEVICE SCALE RESOLUTION

(71) Applicant: Raytheon Company, Waltham, MA (US)

(72) Inventors: Paul T. Hartin, McKinney, TX (US); Kalin Spariosu, Thousand Oaks, CA (US); Thomas T. Leise, Collinsville, TX (US); David A. Vasquez, Gardena, CA (US); Michael R. Patrizi, Lancaster, MA (US)

(73) Assignee: RAYTHEON COMPANY, Waltham, MA (US)

( * ) Notice: Subject to any disclaimer, the term of this patent is extended or adjusted under 35 U.S.C. 154(b) by 234 days.

(21) Appl. No.: 17/352,612

(22) Filed: Jun. 21, 2021

(65) Prior Publication Data
US 2022/0406680 A1 Dec. 22, 2022

(51) Int. Cl.
*H01L 23/38* (2006.01)
*H10N 10/17* (2023.01)
*H10N 10/80* (2023.01)

(52) U.S. Cl.
CPC ............. *H01L 23/38* (2013.01); *H10N 10/17* (2023.02); *H10N 10/80* (2023.02)

(58) Field of Classification Search
CPC ...................................................... H01L 23/38
See application file for complete search history.

(56) References Cited

U.S. PATENT DOCUMENTS

| | | | |
|---|---|---|---|
| 5,515,682 A | 5/1996 | Nagakubo et al. | |
| 6,424,533 B1 * | 7/2002 | Chu ........................ | H10N 10/17 361/719 |
| 6,711,904 B1 * | 3/2004 | Law ........................ | H01L 23/34 62/3.2 |
| 7,436,059 B1 | 10/2008 | Ouyang | |
| 8,659,903 B2 | 2/2014 | Schwartz | |
| 2005/0091989 A1 * | 5/2005 | Leija ....................... | H01L 23/38 62/3.2 |
| 2008/0236175 A1 * | 10/2008 | Chaparro Monferrer ................... | F25B 21/02 257/713 |
| 2013/0141872 A1 * | 6/2013 | Schwartz ................ | F28F 13/00 165/96 |
| 2016/0093553 A1 * | 3/2016 | Prakash .................. | H01L 23/38 361/717 |
| 2017/0222396 A1 * | 8/2017 | Pescod ................ | H01S 5/02415 |

* cited by examiner

*Primary Examiner* — Benjamin P Sandvik
(74) *Attorney, Agent, or Firm* — CANTOR COLBURN LLP

(57) ABSTRACT

A cooling device for integrated circuits. The device includes: a plurality TEC cooling cells arranged in an array, wherein each of the cells includes a controller coupled to at least one TEC device; and a single power connector that provides power to all the cells in the array. The controller of each cell in the array is operable to control the at least one TEC it is coupled to with power received from the single power connector.

12 Claims, 7 Drawing Sheets

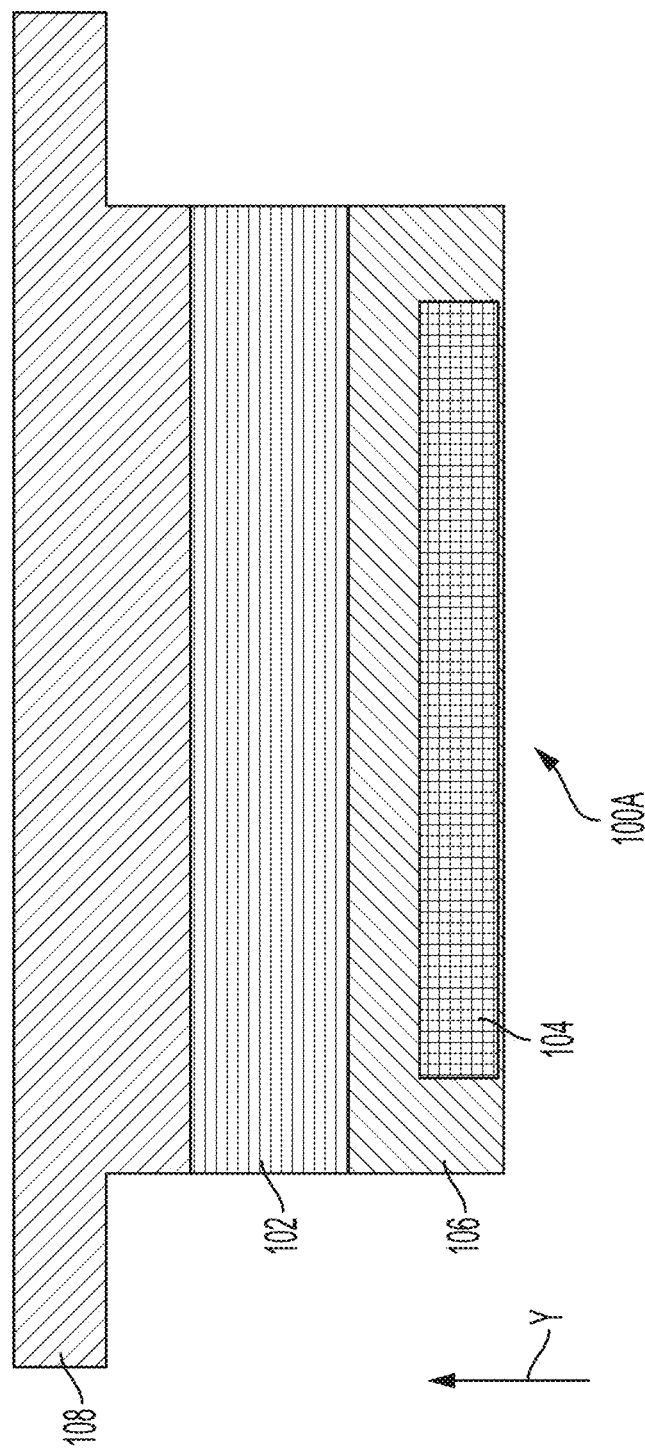

LOCALIZED TARGETED THERMOELECTRIC COOLING THERMAL CONTROL OF INTEGRATED CIRCUITS WITH SUB-DEVICE SCALE RESOLUTION

BACKGROUND OF THE INVENTION

The present disclosure relates to precise thermal control of integrated circuits and, in particular, to using an array of thermoelectric (TEC) devices to regulate temperature in specific locations of the circuit and how the individual TEC devices can be configured, controlled, and arranged.

Integrated circuits (ICs) exhibit inherent timing changes that occur over temperature. They naturally experience temperature variations due to environmental temperature changes during operation. The resulting timing change can cause data link failures or, in the case of timing distribution links, increased errors in the distributed time.

One way to ensure that the IC works correctly is to design the circuit such that timing constraints are met over varying temperature ranges. Such an approach can require extensive simulation and tightly constraining the design to ensure the interface meets requirements at all temperatures. This has proven impractical as tightly constraining the design makes signal routing difficult, increases build costs, and reduces yield—while still not meeting accuracy requirements in many cases. Conventional current state of the art (SOA) device scale thermal management/temperature control approaches do not provide for requisite timing control and have associated power/efficiency penalties.

Other approaches include employing tunable delay lines to adjust the skew of signals in an interface as the temperature changes and utilizing specialized components to adjust signal drive strength based on temperature. Such approaches can add complexity, and increases power consumption.

Another approach includes actively cooling the entire chip with a standard thermoelectric cooler (TEC) but it is inefficient due to having to heat or cool the entire chip. That is, conventional current state of the art (SOA) device scale TEC thermal management/temperature control approaches do not provide for requisite timing control and have associated power/efficiency penalties.

SUMMARY OF THE INVENTION

According to one embodiment, a cooling device for integrated circuits is disclosed. The device includes: a plurality TEC cooling cells arranged in an array, wherein each of the cells includes a controller coupled to at least one TEC device; and a single power connector that provides power to all the cells in the array. The controller of each cell in the array is operable to control the at least one TEC it is coupled to with power received from the single power connector.

According to any prior device or as an alternative, the device can further include one or more alignment elements on each of the plurality of TEC cooling cells.

According to any prior device or as an alternative, the one or more alignment elements include a tab and slot.

According to any prior device or as an alternative, the device can further include a plurality of power contacts on each cell.

According to any prior device or as an alternative, the device can further include a plurality of power lines that extend from an edge of particular cell to the controller.

According to any prior device or as an alternative, the device can further include a plurality of power contacts on each cell connected to the power lines that allow power lines on one cell to be connected to power lines on an adjacent cell.

According to any prior device or as an alternative, the array is disposed directly on top or under a die.

According to any prior device or as an alternative, the controller provides a voltage to a connected TEC device based on a temperature sensed by a sensor.

According to any prior device or as an alternative, the plurality TEC cooling cells includes a first cell and second cell, wherein a temperature window of the first cell is different that the temperature window of the second cell.

According to any prior device or as an alternative, the single power connector is connected to power rails of the integrated circuit.

Also disclosed is an integrated circuit that includes a die and a cooling device disposed above or below the die. The device can be any of the above disclosed cooling devices. The cooling device can be disposed directly on top of or below the die or disposed directly on top of a cover that is disposed over or under a die.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 1A shows a side view an integrated circuit that includes a cooling device as disclosed herein;

DETAILED DESCRIPTION OF THE INVENTION

Embodiments described herein utilize an array of thermoelectric cooling (TEC) devices to cool an integrated circuit (IC). The array can be disposed on a lid of the IC or directly on the IC/die. Each TEC device of the array can be individually controlled and powered based on the temperature of the IC over which it is arranged where the array could also be disposed below the device.

In one embodiment, the TEC device is superlattice device. The TEC device, when powered, "pumps" heat from the IC to ambient. In one embodiment, the TEC device may be formed such that that application of a voltage and current causes heat in one location to be moved to another location. In more detail, application of a voltage V and current to the low temperature side causes heat from to move from one side of the TEC device to the other. The direction of the travel is based on the polarity of the voltage and the rate is based on the magnitude of the current.

Figure 1B:
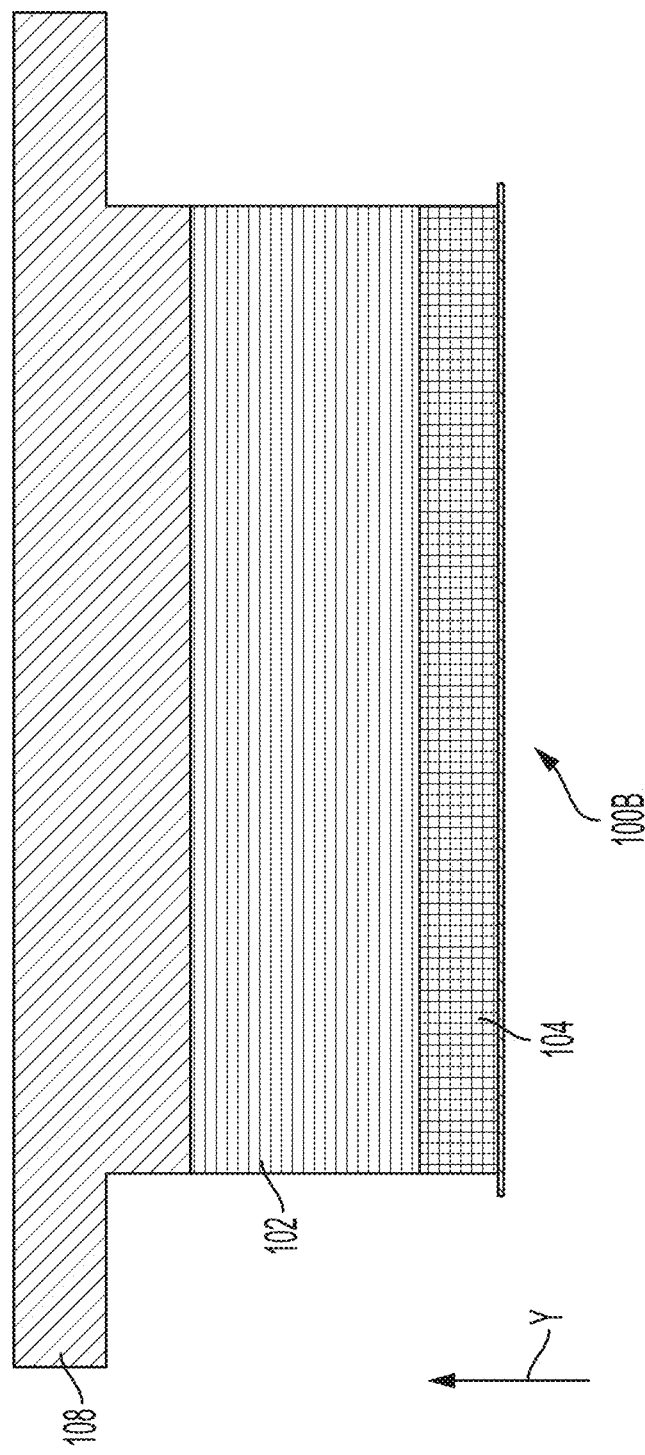
FIG. 1B shows a side view an integrated circuit that includes a cooling device as disclosed herein.
Figure 1C:
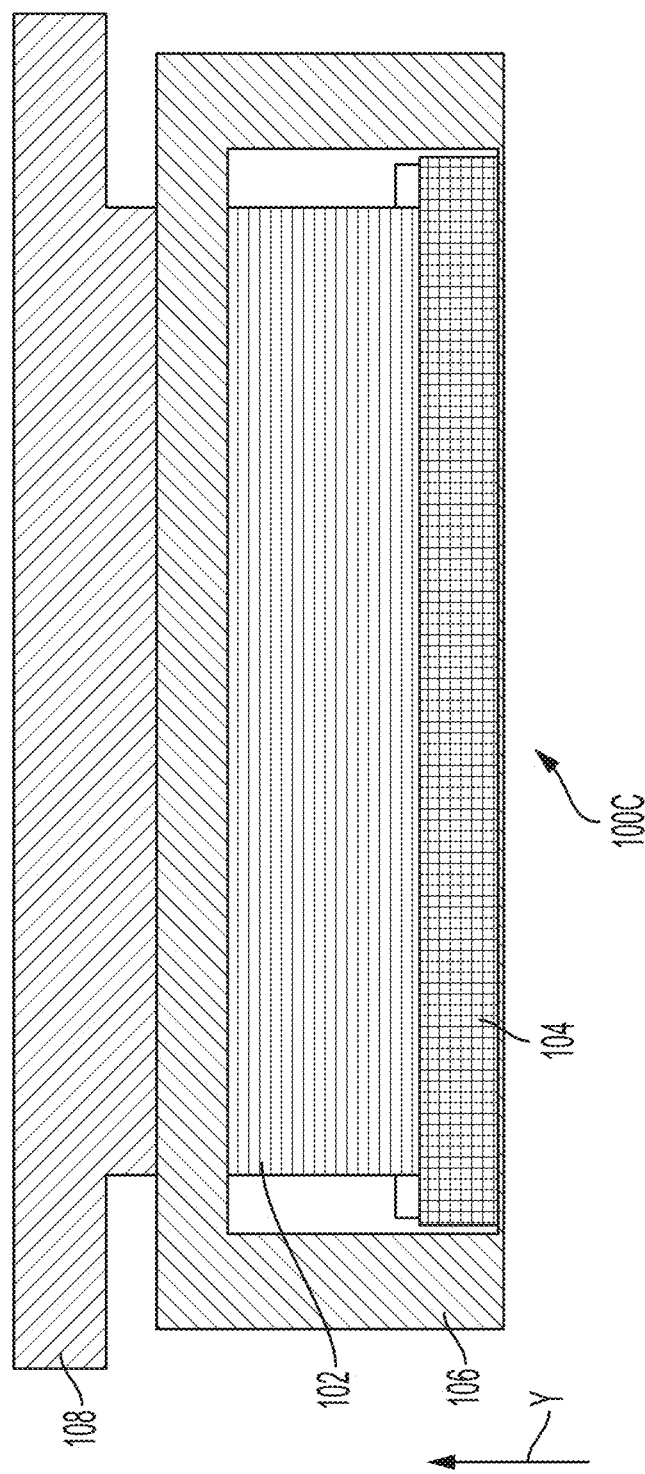
FIG. 1C shows a side view an integrated circuit that includes a cooling device as disclosed herein.

FIG. 1A shows a high-level block diagram of an integrated circuit package 100A where a TEC array 102 according to embodiments can be utilized. The integrated circuit package 100A includes a die 104 and a lid 106. The arrangement of the die and the lid 104, 106 is by way of example and one skilled in the art will realize that other particular configurations are possible. As shown, the lid 106 is above (in the Y direction in FIG. 1) the die 104. The TEC array 102 is shown being disposed on and above the lid 106. Of course, the lid 106 could be omitted (as shown with circuit package 100B of FIG. 1B) or the TEC array 102 could be placed directly on the die 104 between the die 104 and the lid 106 (as shown in circuit package 100C of FIG. 1C). In the embodiment shown in all of FIGS. 1A-1C an optional heat sink 108 can be provided above the other elements.

In all embodiment, the die 104 can be a single chip or an array of chip-lets. In operation certain areas of the die 104 can have different heat build ups. This can negatively affect operation of the die 104 as it can possibly vary the timing/skew of the elements of the die. The array 102 can be arranged such that it provides cooling to specific regions that are outside of specified desired temperature ranges. Based on the disclosure herein, the one skilled in the art will realize that such a TEC array can hold the chip at a constant temperature prevents any thermal skew and preserves the accuracy of the timing interface without having to waste power in regions that do not require cooling. Also, by keeping the die regions in the correct temperature ranges, the amount of simulation of any high speed electrical interfaces can be reduced as temperature variations may not need to be simulated over as wide a range or at all.

The die 104 can embody an FPGA or any other type of die/chip that may need individualized cooling.

Figure 2:
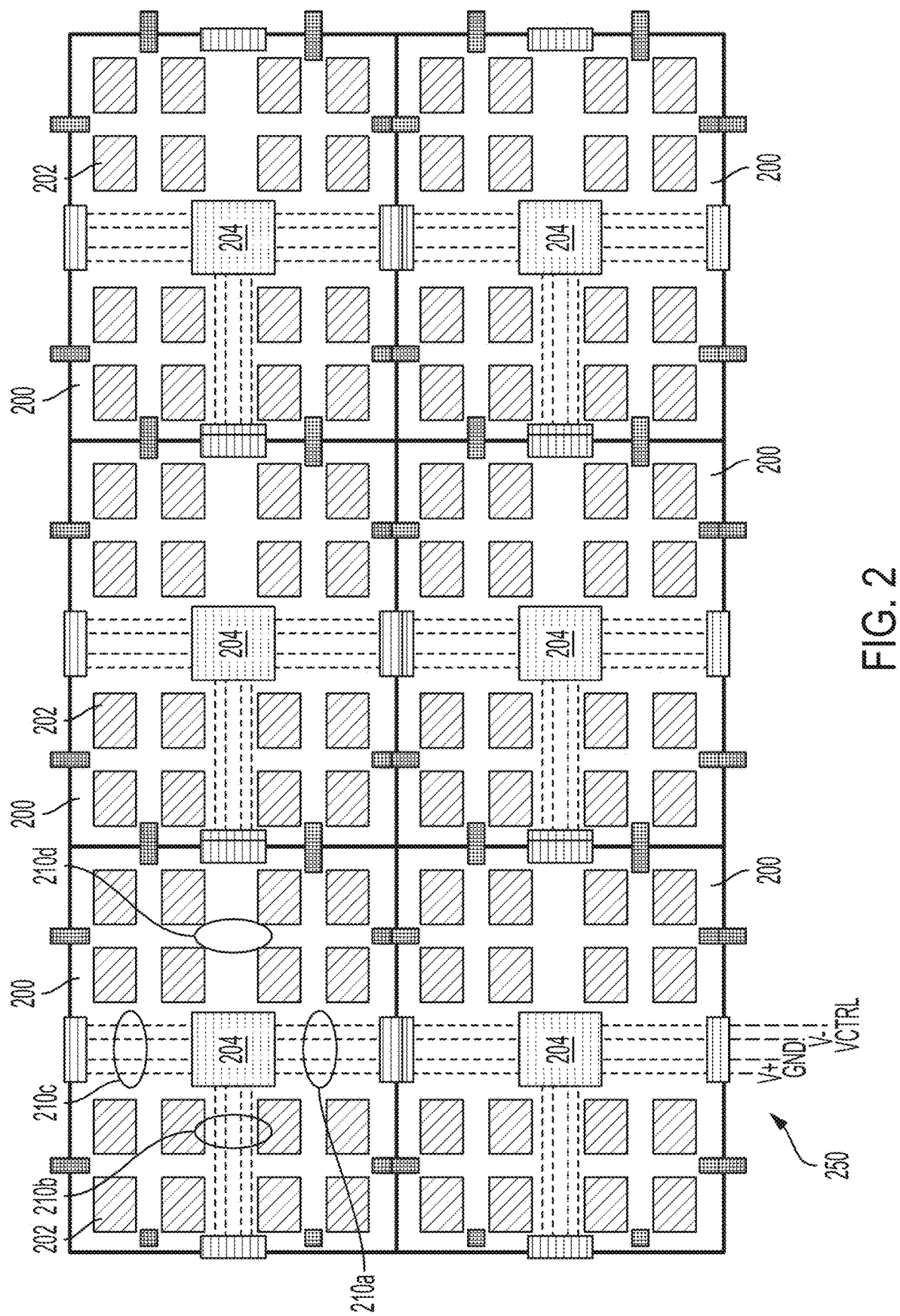
FIG. 2 shows an example of cooling array.

FIG. 2 shows a top view on an example TEC array 102. The TEC array 102 includes a plurality of cells 200. As shown, each cell 200 includes multiple TEC devices 202. In this case, each cell includes 16 devices but this number can be varied from 1 to any desirable number. Each cell also includes a cell controller 204. The cell controller 204 can include inputs (now shown) that receives a signal from a sensor (not shown) related to a temperature of the die below each individual or a group of the TEC devices. Based on these signals, the controller can provide voltage/current to the TEC devices 202 to keep the die in preferred temperature ranges.

That cell controller 204 can include power lines 210 connected to it. As shown, each cell controller 204 includes four sets of power lines 210 connected to it (e.g., 210a, 210b, 210c and 210d). Each set in this non-limiting example can include four lines, V+, V−, ground and a control line Vctrl as indicated in FIG. 2 and extend from the controller to an edge of the cell or to power connector 212 that is at or near the edge of the cell. The cell controller 204 is arranged and configured such that it can receive and pass power on any of these sets of power lines. This can allow a single point of power input (labeled by reference number 250) to provide power to some or all of the cells 200. This can reduce wiring compared to prior art systems where every cell 200 or TEC device 202 require its own wiring. By providing four lines, any shape array can be formed from a standard cell 200. Fewer sets of lines are contemplated and 4 is not required unless specifically called out herein.

In FIG. 2, there is a single power input 250. This power input 250 can provide power to some or all of the cells 200 in the array 102. Herein, if specifically limited herein, a single power input can be limited to one and only one power input. In alternative embodiments, the single power input 250 can provide power to some but not all of the cells 200. In such a case, the array could have two single power inputs, each providing power to one or more cells.

Figure 3:
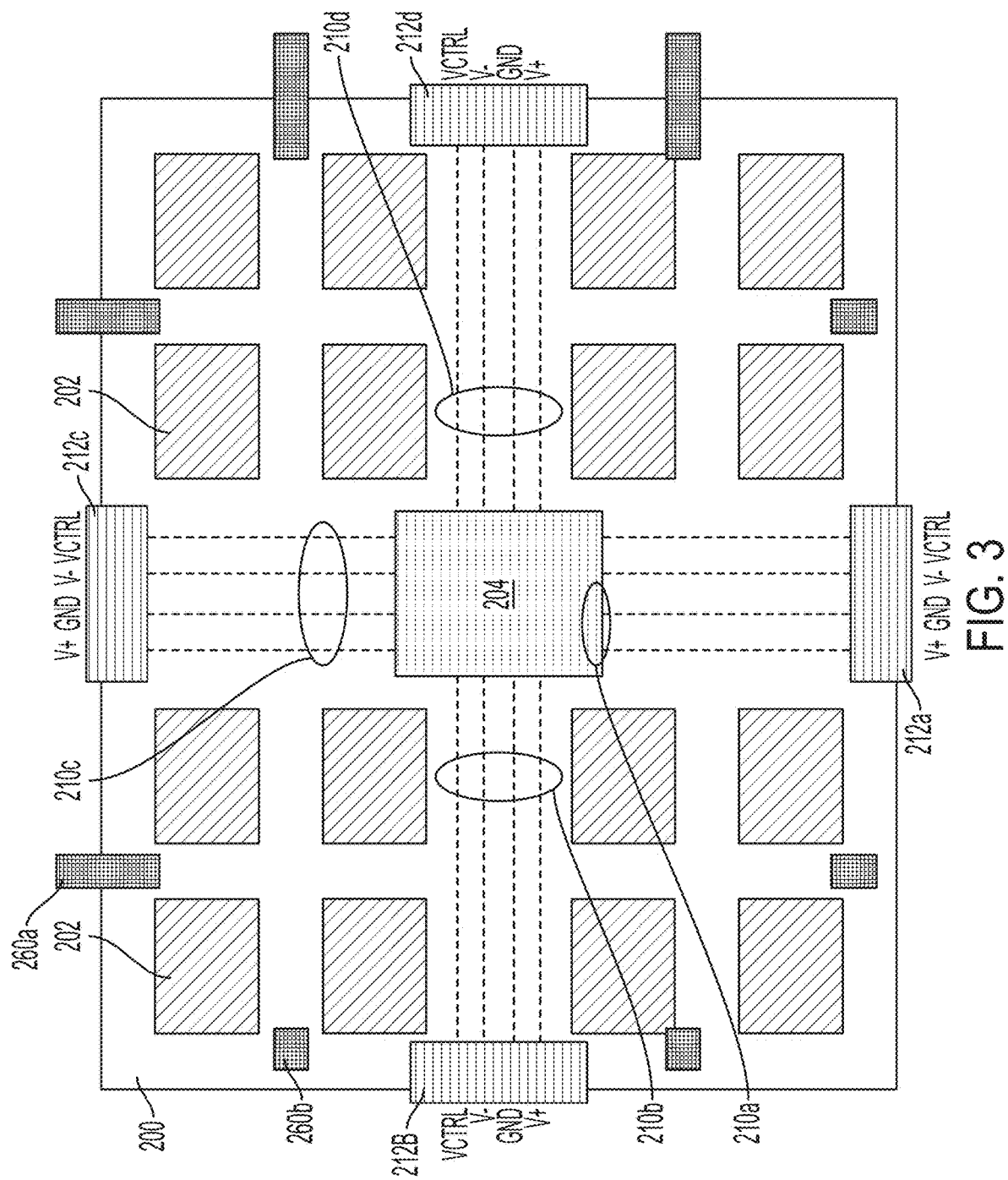
FIG. 3 shows an individual cell of a cooling array.

FIG. 3 shows a single cell 200. The cell 200 as above includes the controller 204 and the four sets of power lines 210 connected to it (e.g., 201a, 210b, 210c and 210d). Each set in this non-limiting example can include four lines, V+, V−, ground and a control line Vctrl as indicated in FIG. 3. The cell 200 includes power contacts that allow for the power lines 201 to be connected to an adjacent cell. As shown, and with reference to FIG. 2 as well, the power contact 212b allows for a connection to the power connector 212d of an adjacent cell and vice versa. Similarly, the power contact 212a allows for a connection to the power connector 212c of an adjacent cell and vice versa. The power contracts are spring connectors in one embodiment. This allows for the controller 204 to pass current received to either from an adjacent cell or the single power input 250 of FIG. 2 to an adjacent cell. In this manner, the power lines can form a power grid or bus from which each controller can receive power and a control signal in order to control its associated TEC devices. The single power input 250 can be of the same form as the power connectors 212.

Figure 4:
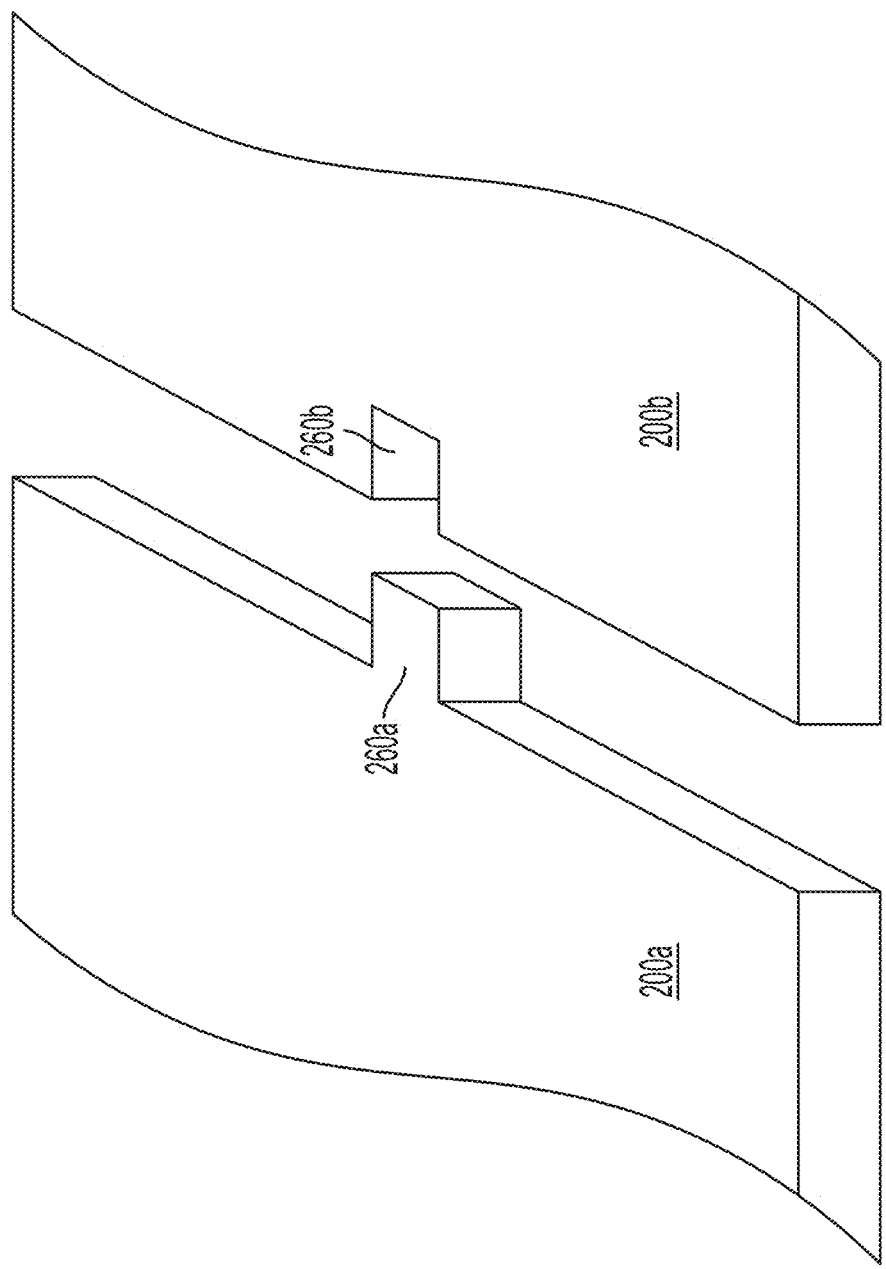
FIG. 4 shows one example of how cells can be connected.

To define the array 102 of FIG. 2, alignment elements 260a/260b can be provided at specified locations on the cell 200. These elements can allow for easy alignment and assembly of the cells 200 into the array 102. The alignment elements can be, respectively, tabs and slots as shown in more detail in FIG. 4 or another type of alignment element. In FIG. 4, a first cell 200a is shown as having a tap 260a that can be inserted into the slot 260b of a second, adjacent cell 200b. In FIGS. 2 and 3 a particular configuration of tabs/slots representing elements 260a/260b is illustrated. Variations could be made in certain instances and the particular configuration is but one example.

Based on the above, certain embodiments should now be clear. In the above embodiments, each cell is designed to be dynamically scalable to a larger grid. By having each cell have its own controller, each cell can provide individualized localized heating/cooling based on the temperature of the area it overlays to provide optimized dynamic targeted temperature control In some cases, if a particular region of the die is within a designated temperature window, no control is needed and the individual cells within the array only turn on when the localized temperature exceeds or falls below the boundaries of temperature window. This also provides for significant power saving and enhanced thermal management efficiency.

Further, forming an array of cells as described herein with positive and negative voltages and ground extending to all four sides of the cell for connection to adjacent cells enables power to be only applied to one cell and propagated automatically to the others.

In the prior examples the controller 204 has been illustrated as being centrally located for simplicity but this is not a requirement.

It is noted that certain modifications can also be provided. For example, each cell can have different temperature set points (e.g., different temperature windows) to provide thermal management flexibility over more time critical regions. For example, a first given cell it could have a range from 0 to 85 C and be arranged over a region where the interfaces are not particularly timing dependent and a second cell could have a window from 80 to 85 C and be over a region of the die where temperature based timing variations need to be minimized. By having these different control windows, less power can be expended in the less time critical region while still maintaining tight control over regions where temperature based timing errors could have more undesirable results.

Figure 5:
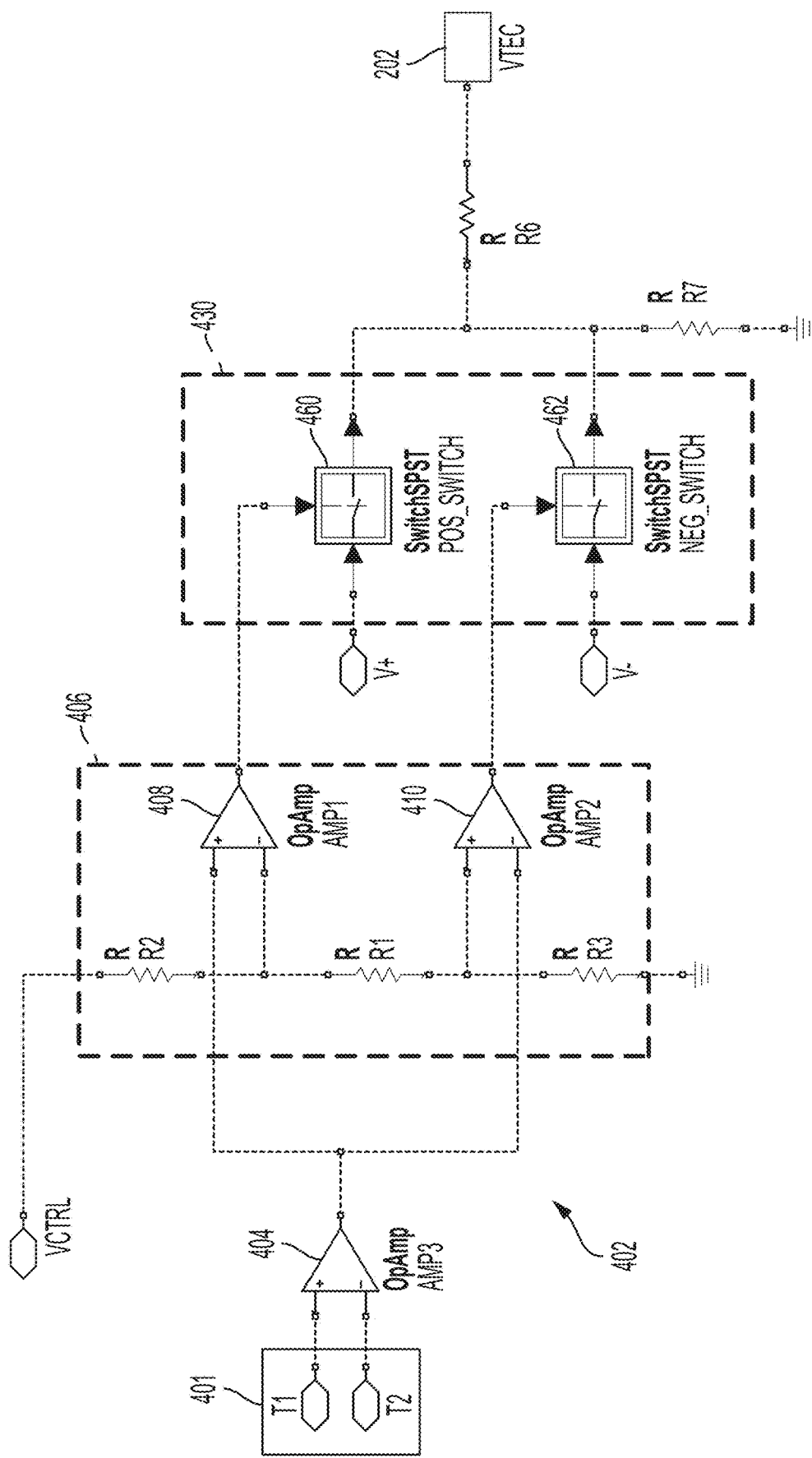
FIG. 5 shows an example control circuit for a TEC device that can be utilized by a controller.

With reference now to FIG. 5, according to one embodiment, the controller 204 can include a control circuit 402 for each TEC device within its respective cell 200. Such a circuit can include, for example, the control circuit 402 that can receive inputs from a temperature sensor 401 such as a thermocouple to provide temperature sensing capabilities. FIG. 5 shows as specific temperature sensor that provides thermocouple outputs T1 and T2 as inputs to the circuit 402 but other sensors could be used.

These inputs received from the thermocouple outputs T1 and T2 can be differential inputs in one embodiment and are provided to differential amplifier 404. The output of the differential amplifier 404 is provided to a window comparator 406. The window comparator 406 can be formed in any manner but as shown it includes serially connected resistors (R1, R2, R3) connected between a control voltage Vctrl and ground. Changing R1, R2, and R3 changes the heat/cool set points. As illustrated, a positive and a negative op amp 408, 410 are connected to the output of the differential amplifier.

Based on the output of the window comparator 406, a switch network 430 can be operated to provide either no voltage, a positive voltage, or a negative voltage to cause a TEC device 202 to pump heat in a particular direction. The flow from the window comparator 406 to the TEC device 202 is controlled by two or more switches that form a switching network 430. An example switching network 430 is shown in FIG. 5.

Based on the circuit shown in FIG. 5, the skilled artisan will realize that when the temperature sensed by the temperature sensor such as thermocouple (and as represented by the output of the differential amplifier 404) is within an acceptable range, the outputs of positive and negative op amps is at a logical low and no voltage is provided to the TEC device 202 via the switching network 430. When the temperature sensed by the thermocouple is above the acceptable level, the first switch 460 of the switching network 430 becomes conductive and passes V+ to the TEC device 202. When the temperature sensed by the thermocouple is below the acceptable level, the second switch 462 of the switching network 430 becomes conductive and passes V− to the TEC device 202. Certain other resistors are shown in FIG. 5 and can be utilized to set current limits and bleed down voltages as needed. Based on the above, such a power and control circuit can allow for directly powering and controlling the TEC device 202 using only standard VPX rail voltages. Of course, based on this disclosure, other circuits could be created that allow for, for example, shifting the range up/down and varying the delta of each range but this may require additional voltages being provided to the controller 204.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A cooling device for integrated circuits, the device comprising:
   a plurality TEC cooling cells arranged in an array, wherein each of the cells includes a controller coupled to at least one TEC device;
   a single power connector that provides power to all the cells in the array;
   wherein the controller of each cell in the array is operable to control the at least one TEC it is coupled to with power received from the single power connector; and
   one or more alignment elements on each of the plurality of TEC cooling cells.

2. The device of claim 1, wherein the one or more alignment elements include a tab and slot.

3. The device of claim 1, further comprising a plurality of power contacts on each cell.

4. The device of claim 3, further comprising a plurality of power lines that extend from an edge of particular cell to the controller.

5. The device of claim 1, wherein the array is disposed directly on top or under a die.

6. The device of claim 1, wherein the controller provides a voltage to a connected TEC device based on a temperature sensed by a sensor.

7. The device of claim 1, wherein the plurality TEC cooling cells includes a first cell and second cell, wherein a temperature window of the first cell is different that the temperature window of the second cell.

8. The device of claim 1, wherein the single power connector is connected to power rails of the integrated circuit.

9. A cooling device for integrated circuits, the device comprising:
   a plurality TEC cooling cells arranged in an array, wherein each of the cells includes a controller coupled to at least one TEC device;
   a single power connector that provides power to all the cells in the array;
   wherein the controller of each cell in the array is operable to control the at least one TEC it is coupled to with power received from the single power connector;
   a plurality of power contacts on each cell,
   a plurality of power lines that extend from an edge of at least one of each cell to the controller;
   wherein the plurality of power contacts on each cell are connected to the power lines to allow power lines on one cell to be connected to power lines on an adjacent cell.

10. An integrated circuit comprising:
    a die;
    a cooling device disposed above or below the die, the device comprising:

a plurality TEC cooling cells arranged in an array, wherein each of the cells includes a controller coupled to at least one TEC device; and a single power connector that provides power to all cells in the array;

wherein the controller of each cell in the array is operable to control the at least one TEC it is coupled to with on power received from the single power connector;

a plurality of power lines that extend from an edge of at least one of each cell to the controller; and a plurality of power contracts on each cell connected to the power lines that allow power lines on one cell to be connected to power lines on an adjacent cell.

11. The integrated circuit of claim 10, wherein the cooling device is disposed directly on top of or below the die.

12. The integrated circuit of claim 10, wherein the cooling device is disposed directly on top of a cover that is disposed over or under a die.

* * * * *